(12) United States Patent  
Chung (10) Patent No.: US 7,863,992 B2  
(45) Date of Patent: Jan. 4, 2011

(54) OSCILLATOR HAVING COMPARATOR CIRCUITS HAVING ADJUSTABLE DRIVING CAPABILITIES AND METHOD FOR OPERATING THE SAME

(75) Inventor: Kyu-Young Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 12/283,540

(22) Filed: Sep. 12, 2008

(65) Prior Publication Data

US 2009/0072918 A1     Mar. 19, 2009

(30) Foreign Application Priority Data

Sep. 14, 2007    (KR) ...................... 10-2007-0093669

(51) Int. Cl.
*H03K 3/26*    (2006.01)
(52) U.S. Cl. ...................... 331/111; 331/135; 331/143; 327/131; 327/182
(58) Field of Classification Search ................. 331/111, 331/143, 135; 327/131, 182
See application file for complete search history.

(56) References Cited

U.S. PATENT DOCUMENTS

| | | | |
|---|---|---|---|
| 4,479,097 A | 10/1984 | Larson et al. | |
| 5,418,502 A | 5/1995 | Ma et al. | |
| 5,570,067 A | 10/1996 | Shacter | |
| 6,914,494 B1 | 7/2005 | Chen | |
| 7,525,394 B2 * | 4/2009 | Gerber et al. | ............... 331/143 |

FOREIGN PATENT DOCUMENTS

KR     2000-0018355     4/2000

* cited by examiner

*Primary Examiner*—Arnold Kinkead
(74) *Attorney, Agent, or Firm*—Mills & Onello, LLP (57) ABSTRACT

An oscillator includes a first comparator circuit, a second comparator circuit, an oscillation signal generator circuit, and a frequency voltage generator circuit. The first comparator circuit generates a first pulse when a frequency voltage reaches a first reference voltage, and the second comparator circuit generates a second pulse when the frequency voltage reaches a second reference voltage. The oscillation signal generator circuit generates an oscillation signal by latching a first voltage in response to the first pulse and latching a second voltage in response to the second pulse. The frequency voltage generator circuit raises or lowers the frequency voltage in response to the oscillation signal. The driving capability of the first comparator circuit is reduced at the latching of the first voltage and is restored at the latching of the second voltage. The driving capability of the second comparator circuit is reduced at the latching of the second voltage and is restored at the latching of the first voltage.

13 Claims, 12 Drawing Sheets

Driving Capability
B,C > A,C

OSCILLATOR HAVING COMPARATOR CIRCUITS HAVING ADJUSTABLE DRIVING CAPABILITIES AND METHOD FOR OPERATING THE SAME

CROSS-REFERENCE TO RELATED APPLICATIONS

This U.S. non-provisional patent application claims priority under 35 U.S.C. §119 to Korean Patent Application No. 10-2007-0093669, filed on Sep. 14, 2007, the entire contents of which are hereby incorporated by reference.

BACKGROUND OF THE INVENTION

The present invention described herein relates to an oscillator and a method for operating the same.

Typically, oscillators are used to provide a clock signal or a timing signal to electronic circuits such as microprocessors, micro-controllers, flip-flops, and latches, and are used widely in electronic systems. An accurate and stable reference frequency can be obtained using a crystal oscillator.

However, since many application fields do not require such a high-quality reference frequency and are subject to the requirements of mass production, a resistor-capacitor oscillator is used as a lower-cost source of a clock signal source or a timing signal. The resistor-capacitor oscillator is advantageous in that it generates a variable frequency by changing a resistance R or a capacitance C and also makes it possible to avoid the use of an inductor that is difficult to fabricate in an integrated circuit.

Low power consumption is desirable in mobile systems that use a battery, such as mobile communication devices and portable electronic devices. Low power consumption is advantageous in increasing the lifetime of the battery. Thus, in such application fields, it is generally advantageous to use an ultralow-power resistor-capacitor oscillator that is low in power consumption.

Figure 1:
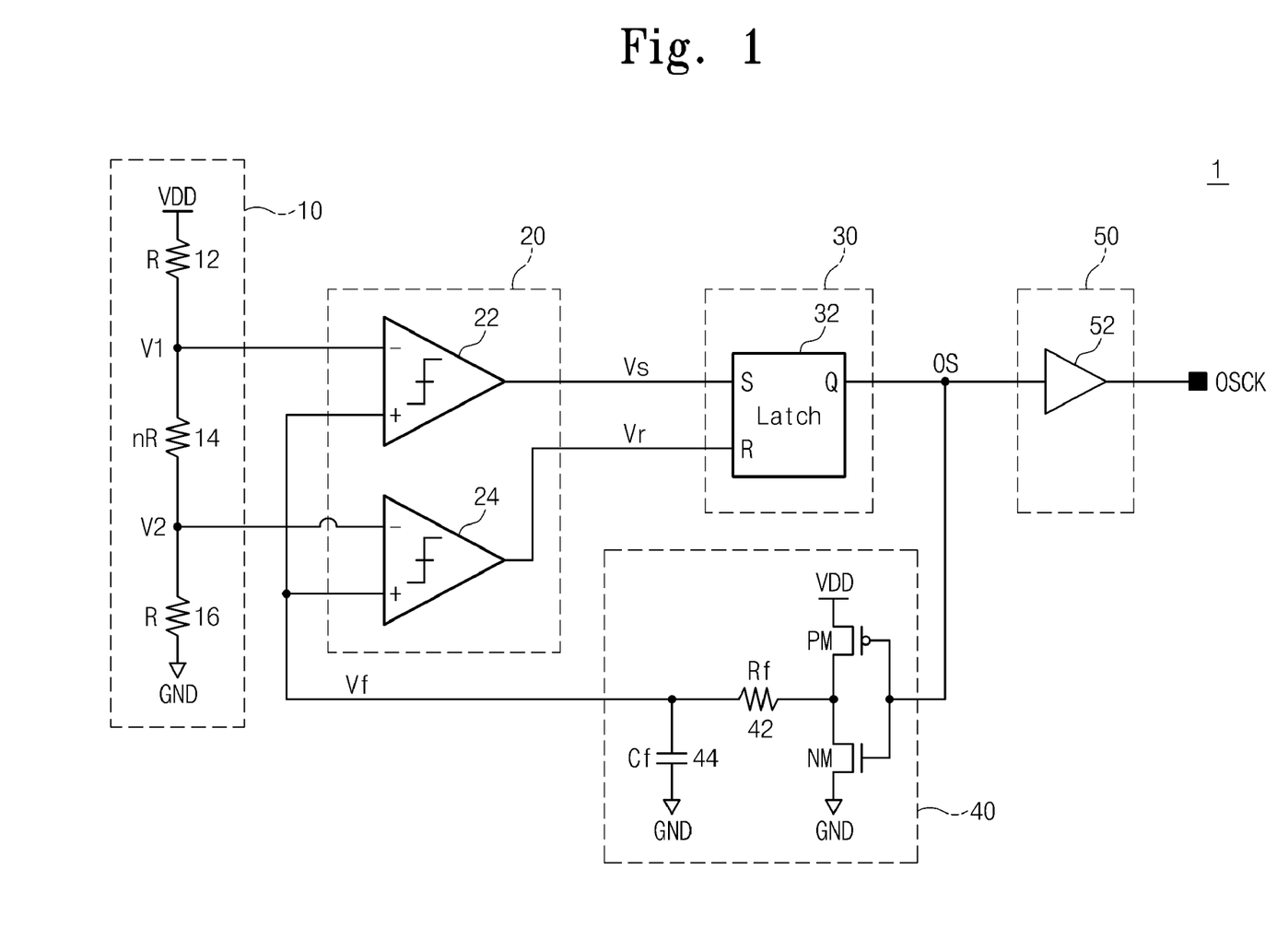
FIG. 1 is a diagram illustrating a typical resistor-capacitor oscillator.

FIG. 1 is a circuit diagram of a typical resistor-capacitor oscillator.

Referring to FIG. 1, a resistor-capacitor oscillator 1 includes a reference voltage generator circuit 10, a voltage comparator circuit 20, an oscillation signal generator circuit 30, a frequency voltage generator circuit 40, and an output circuit 50. The reference voltage generator circuit 10 generates a first reference voltage V1 and a second reference voltage V2 by resistance division. The voltage comparator circuit 20 includes a first comparator circuit 22 comparing the first reference voltage V1 with a frequency voltage Vf, and a second comparator circuit 24 comparing the second reference voltage V2 with the frequency voltage Vf.

Figure 2:
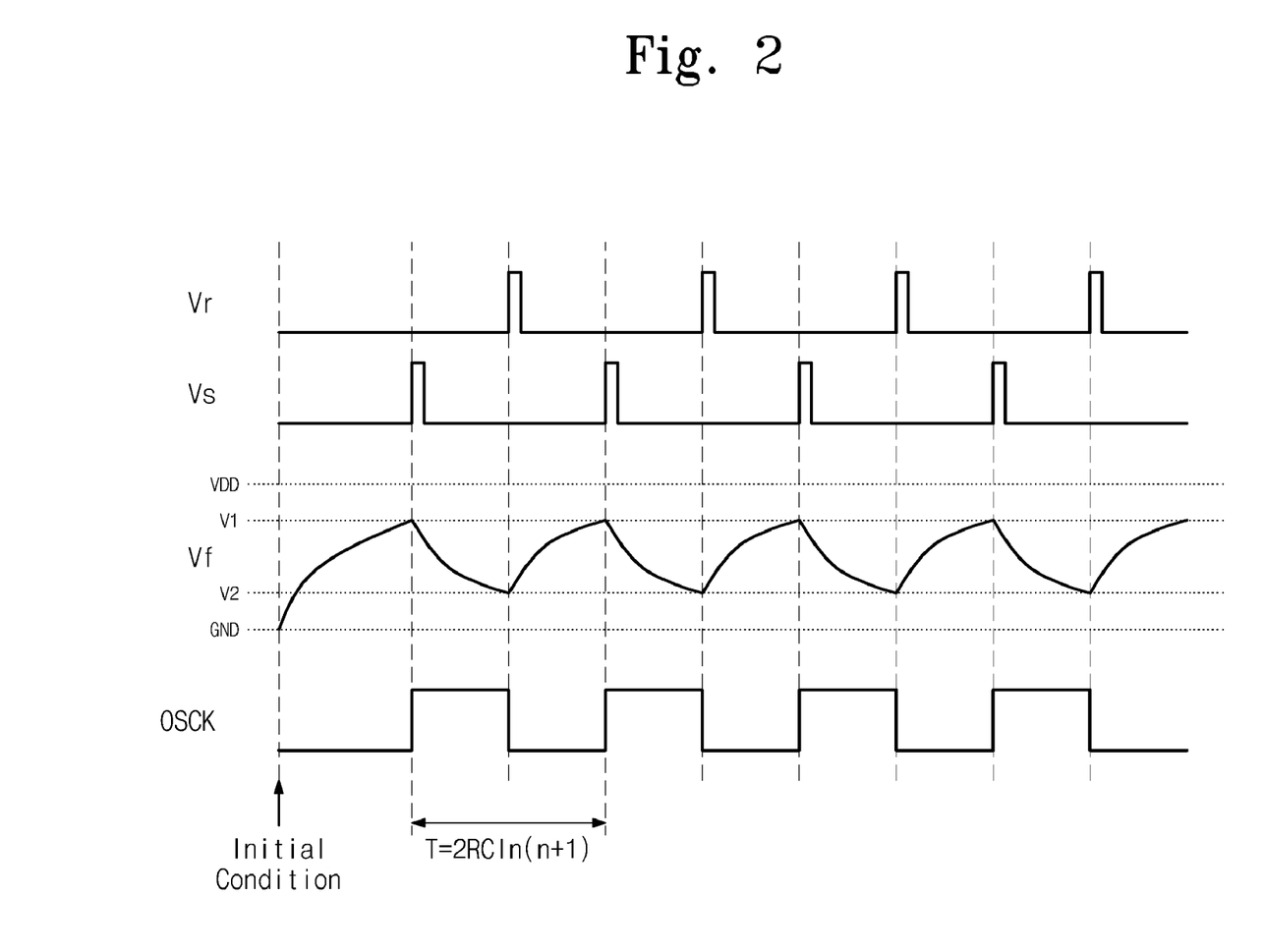
FIG. 2 is a timing diagram illustrating that an oscillation clock is generated by the resistor-capacitor oscillator illustrated in FIG. 1.

FIG. 2 is a timing diagram illustrating an oscillation clock generated by the resistor-capacitor oscillator 1 illustrated in FIG. 1.

Referring to FIGS. 1 and 2, an oscillation clock OSCK is generated as follows. The voltage level of an oscillation signal OS is low at an initial condition. Thus, in the frequency voltage generator circuit 40, a PMOS transistor PM is turned on and an NMOS transistor NM is turned off. Thus, a capacitor 44 starts to be charged. Accordingly, the frequency voltage Vf increases depending on a time constant $R_f C_f$. In general, the frequency voltage Vf increases according to Equation (1).

$$V_f = \left(1 - e^{-\frac{t}{R_f C_f}}\right) VDD \quad (1)$$

The first comparator circuit 22 compares the first reference voltage V1 with the frequency voltage Vf, and outputs a set pulse Vs when the first reference voltage V1 is equal to the frequency voltage Vf. Herein, the first reference voltage V1 satisfies Equation (2) according to voltage division.

$$V_1 = \frac{n+1}{n+2} VDD \quad (2)$$

For generation of the set pulse Vs, the first reference voltage V1 must be equal to the frequency voltage Vf. Therefore, Equation (3) is derived from Equation (1) and Equation (2).

$$1 - e^{-\frac{t}{R_f C_f}} = \frac{n+1}{n+2} \quad (3)$$

The oscillation signal generator circuit 30 latches a high level in response to the set pulse Vs. Thus, the oscillation clock OSCK will maintain a high-level state for a predetermined period. In contrast, if the oscillation signal OS is at a high level, the PMOS transistor PM of the frequency voltage generator circuit 40 is turned off and the NMOS transistor NM is turned on. Thus, the capacitor 44 starts to be discharged to ground GND. Accordingly, the frequency voltage Vf decreases depending on the time constant $R_f C_f$. In general, the frequency voltage Vf decreases according to Equation (4).

$$V_f = e^{-\frac{t}{R_f C_f}} VDD \quad (4)$$

The second comparator circuit 24 compares the second reference voltage V2 with the frequency voltage Vf, and outputs a reset pulse Vr when the second reference voltage V2 is equal to the frequency voltage Vf. Herein, the second reference voltage V2 satisfies Equation (5) according to voltage division.

$$V_2 = \frac{1}{n+2} VDD \quad (5)$$

For generation of the reset pulse Vr, the second reference voltage V2 must be equal to the frequency voltage Vf. Therefore, Equation (6) is derived from Equation (4) and Equation (5).

$$e^{-\frac{t}{R_f C_f}} = \frac{1}{n+2} \quad (6)$$

The oscillation signal generator circuit 30 latches a low level in response to the reset pulse Vr. Thus, the oscillation clock OSCK will maintain a high-level state for a predetermined period. In contrast, if the oscillation signal OS is at a low level, the PMOS transistor PM of the frequency voltage generator circuit 40 is turned on and the NMOS transistor NM is turned off. Thus, the capacitor 44 starts to be charged, and the frequency voltage Vf will increase. As described above, the charge and discharge of the capacitor 44 are repeated to generate the oscillation clock OSCK.

Herein, the cycle period T of the oscillation clock OSCK will satisfy Equation (7) according to Equation (3) and Equation (6).

$$T=2R_fC_f\ln(n+1) \quad (7)$$

In the comparator circuits 22 and 24 of the oscillator 1, the driving speed differs depending on the amplitude of a bias current. For example, the driving speed increases as the bias current increases.

Figure 3A:
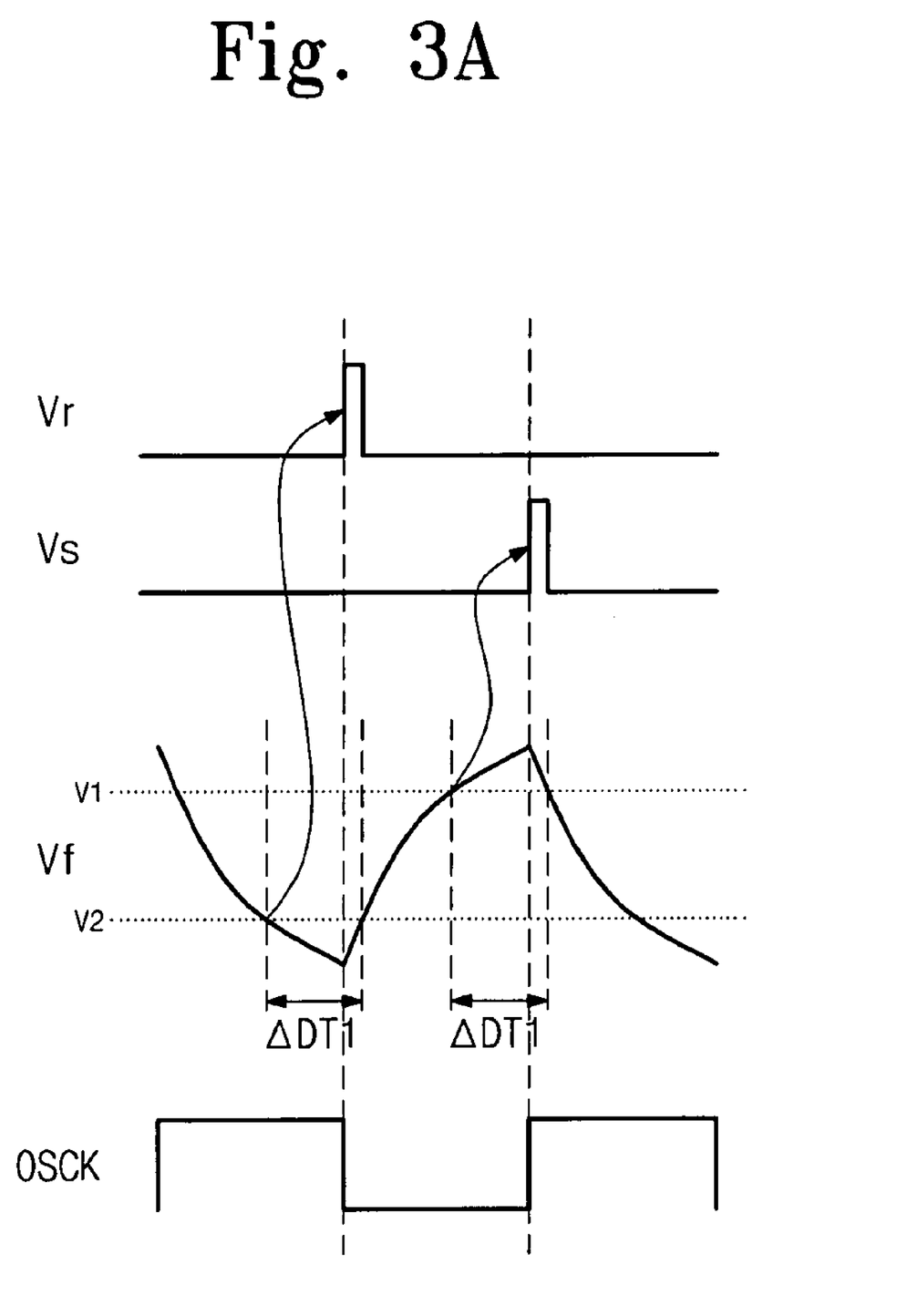
FIG. 3A is a timing diagram illustrating the driving speed of the comparator circuit when the bias current is small.
Figure 3B:
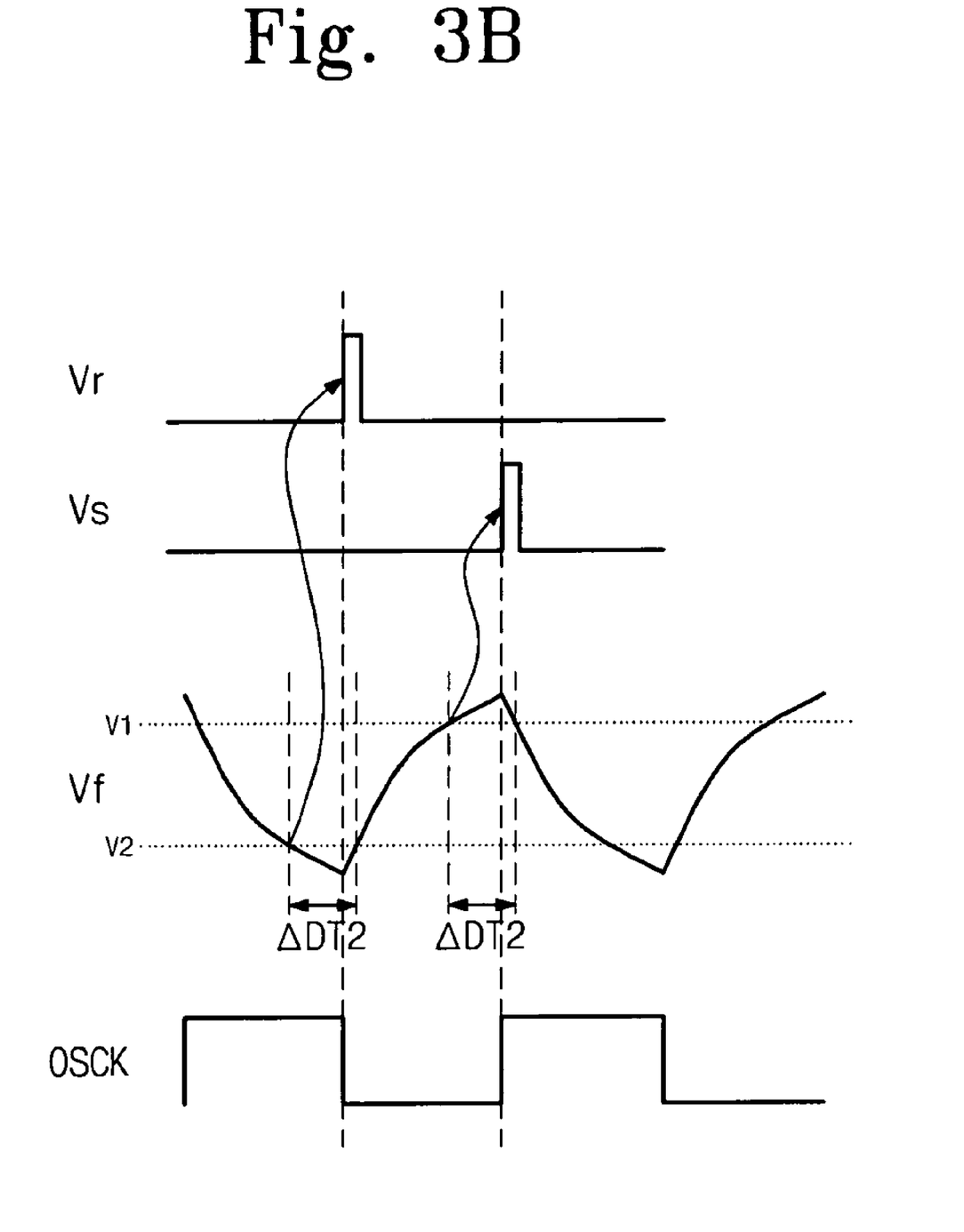
FIG. 3B is a timing diagram illustrating the driving speed of the comparator circuit when the bias current is large.

FIGS. 3A and 3B are timing diagrams illustrating a difference in the driving speed of the comparator circuit depending on the magnitude of the bias current. FIG. 3A is a timing diagram illustrating the driving speed of the comparator circuit when the bias current is small.

Referring to FIGS. 1 and 3A, the second comparator circuit 24 outputs the reset pulse Vr delayed by a first time ΔDT1, even if the second reference voltage V2 is equal to the frequency voltage Vf. Thus, the oscillation clock OSCK becomes a low-level state in response to the output reset pulse Vr. Also, the first comparator circuit 22 outputs the set pulse Vs delayed by the first time ΔDT1, even if the first reference voltage V1 is equal to the frequency voltage Vf. Thus, the oscillation clock OSCK becomes a high-level state in response to the output set pulse Vs.

FIG. 3B is a timing diagram illustrating the driving speed of the comparator circuit when the bias current is large.

Referring to FIGS. 1 and 3B, the second comparator circuit 24 outputs the reset pulse Vr delayed by a second time ΔDT2, even if the second reference voltage V2 is equal to the frequency voltage Vf. Herein, the second time ΔDT2 is shorter than the first time ΔDT1 illustrated in FIG. 3A.

The driving speeds of the comparator circuits 22 and 24 increase as the bias current increases. Thus, as the required frequency of the oscillation clock OSCK increases, the bias current must also increase to improve the operational characteristics. However, an increase in the bias current leads to an increase in the power consumption.

SUMMARY OF THE INVENTION

The present invention provides an oscillator and a method for operating the same, which can prevent a power consumption increase while generating a high-frequency oscillation clock.

Embodiments of the present invention provide oscillators having comparator circuits whose driving capability is adjusted according to voltage latch.

According to one aspect, the present invention is directed to an oscillator which includes a first comparator circuit generating a first pulse when a frequency voltage reaches a first reference voltage; a second comparator circuit generating a second pulse when the frequency voltage reaches a second reference voltage; an oscillation signal generator circuit generating an oscillation signal by latching a first voltage in response to the first pulse and latching a second voltage in response to the second pulse; and a frequency voltage generator circuit raising or lowering the frequency voltage in response to the oscillation signal. The driving capability of the first comparator circuit is reduced at the latching of the first voltage and is restored at the latching of the second voltage. The driving capability of the second comparator circuit is reduced at the latching of the second voltage and is restored at the latching of the first voltage.

In some embodiments, the frequency voltage is raised or lowered using an RC time constant.

In some embodiments, the first comparator circuit includes a first pull-down driver for adjusting the driving capability thereof, and the second comparator circuit includes a second pull-down driver for adjusting the driving capability thereof.

In some embodiments, the oscillator further includes a pull-down driver controller receiving the first and second pulses to drive the first and second pull-down drivers.

In some embodiments, the pull-down driver controller generates a first control signal for driving the first pull-down driver and a second control signal for driving the second pull-down driver.

In some embodiments, the first and second control signals are output complementarily.

In still further embodiments, the pull-down driver controller includes: a first flip-flop latching a supply voltage in response to the first pulse; a second flip-flop latching the supply voltage in response to the second pulse; a first inverter inverting an output of the first flip-flop; a second inverter inverting an output of the second flip-flop; a NAND logic circuit NAND-operating an output of the first inverter and an output of the second inverter to generate the first control signal; and a third inverter inverting the first control signal to generate the second control signal. The first flip-flop is reset in synchronization with the output of the second inverter. The second flip-flop is reset in synchronization with the output of the first inverter.

In some embodiments, the first and second pulses are delayed and provided respectively to the first and second flip-flops.

In some embodiments, the first and second pull-down drivers are implemented using current sources.

In some embodiments, the oscillator further includes an output circuit outputting the oscillation signal.

In some embodiments, the time of the restoration of the driving capability of the first comparator circuit is delayed by a first time, and the time of the restoration of the driving capability of the second comparator circuit is delayed by a second time.

In some embodiments, the first comparator circuit includes a first pull-down driver for adjusting the driving capability thereof, and the second comparator circuit includes a second pull-down driver for adjusting the driving capability thereof.

In some embodiments, the oscillator further includes a pull-down driver controller for driving the first and second pull-down drivers.

In some embodiments, the pull-down driver controller generates a first control signal for driving the first pull-down driver and a second control signal for driving the second pull-down driver.

In some embodiments, the pull-down driver controller includes: a first delay circuit delaying the oscillation signal by a first time; a second delay circuit delaying an output of the first delay circuit by a second time; an AND logic circuit AND-operating an output of the first delay circuit and an output of the second delay circuit to generate the first control signal; and a NOR logic circuit NOR-operating the output of the first delay circuit and the output of the second delay circuit to generate the second control signal.

In some embodiments, the first and second pull-down drivers are implemented using current sources.

According to another aspect, the present invention is directed to a method for operating an oscillator which includes: latching a first voltage from a rising frequency voltage; latching a second voltage from a lowering frequency voltage; and sequentially latching the first voltage and the second voltage to output an oscillation signal. The frequency voltage is raised or lowered in response to the oscillation signal. A driving capability is reduced at the latching of the first voltage and is restored at the latching of the second voltage, or the driving capability is reduced at the latching of the second voltage and is restored at the latching of the first voltage.

BRIEF DESCRIPTION OF THE FIGURES

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIGS. 3A and 3B are timing diagrams illustrating a difference in the driving speed of a comparator circuit depending on the magnitude of a bias current.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this description will be thorough and complete, and will fully convey the scope of the present invention to those skilled in the art.

An oscillator of the present invention includes comparator circuits whose driving capability is reduced upon completion of voltage latch. Thus, in comparison with the typical oscillator, the oscillator of the present invention can reduce power consumption while generating a high-frequency oscillation clock.

Figure 4:
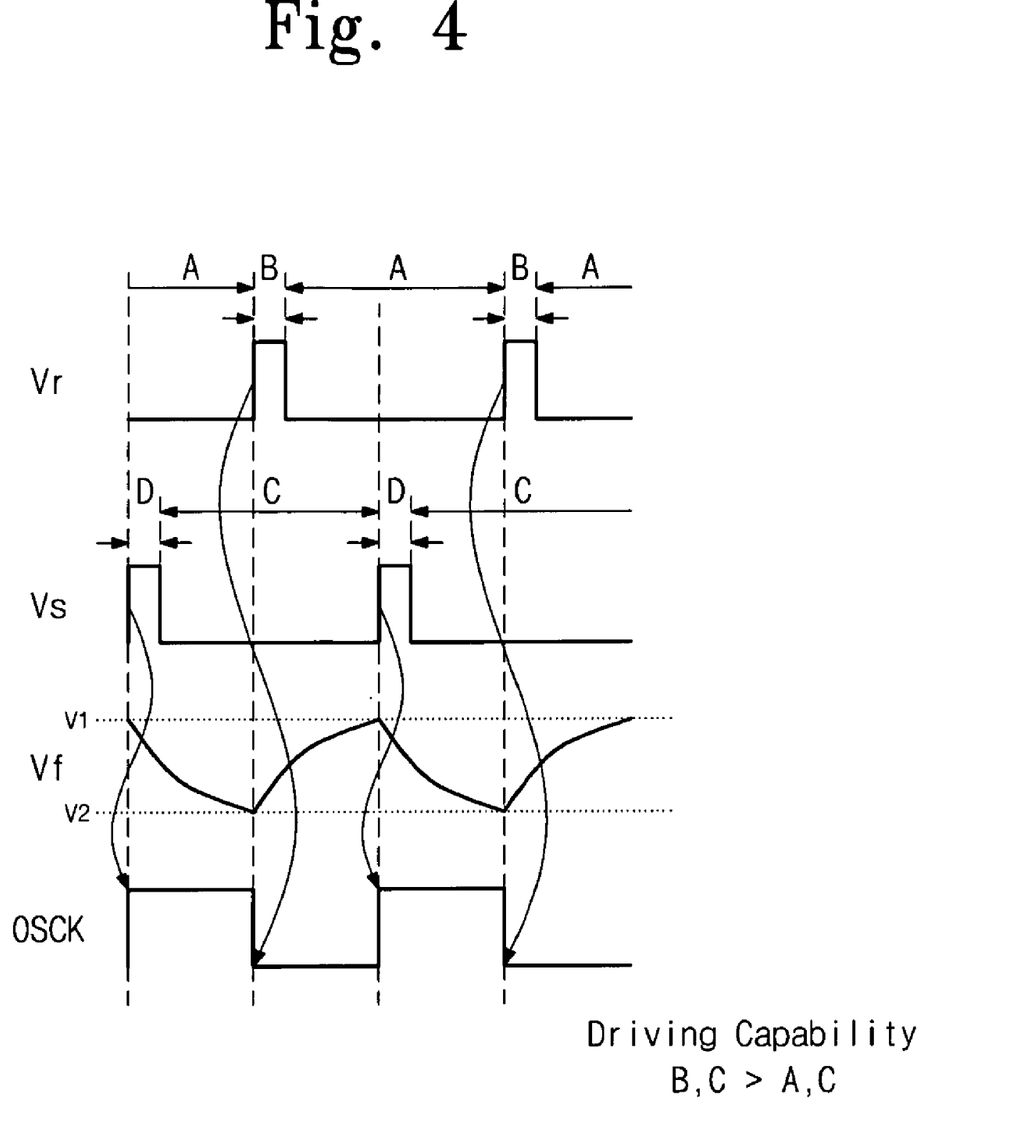
FIG. 4 is a timing diagram illustrating the present invention.

FIG. 4 is a timing diagram illustrating an embodiment of the present invention.

Referring to FIG. 4, an oscillation clock OSCK transitions from a high level to a low level or from a low level to a high level in state transition periods B and D, and sustains a high level or a low level in state sustain periods A and C. An oscillator of the present invention is configured in such a way that the driving capability of a comparator circuit is reduced in the state sustain periods A and C compared with the state transition periods B and D.

In particular, the driving capability of the comparator circuit is proportional to the magnitude of a bias current. That is, the magnitude of a bias current in the state transition periods B and D is designed to be larger than the magnitude of a bias current in the state sustain periods A and C. For example, it is designed such that an additional bias current source operates in the state transition periods B and D. Hereinafter, an oscillator of the present invention and a method for operating the same will be described in detail with reference to FIGS. 5 through 10.

Figure 5:
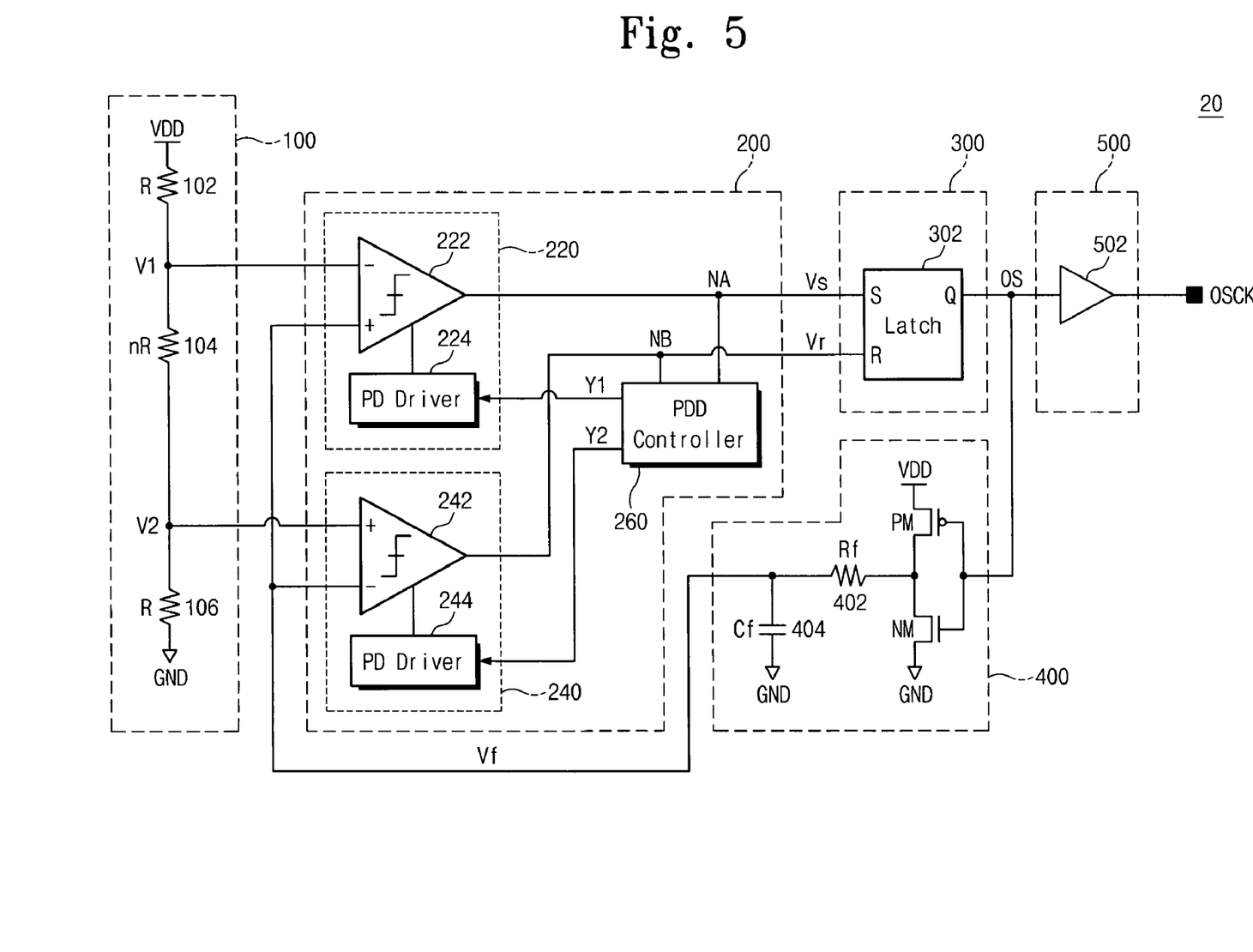
FIG. 5 is a diagram illustrating an oscillator according to an embodiment of the present invention.

FIG. 5 is a diagram illustrating an oscillator according to an embodiment of the present invention.

Referring to FIG. 5, an oscillator 20 includes a reference voltage generator circuit 100, a voltage comparator circuit 200, an oscillation signal generator circuit 300, a frequency voltage generator circuit 400, and an output circuit 500. The voltage comparator circuit 200 of the oscillator 20 includes comparator circuits 220 and 240 whose driving capability is reduced upon completion of voltage latch. The oscillator 20 illustrated in FIG. 5 is a resistor-capacitor oscillator. However, the oscillator of the present invention should not be limited to a resistor-capacitor oscillator. The present invention is applicable to any oscillator that is designed to oscillate by sequentially latching different voltages.

The reference voltage generator circuit 100, the oscillation signal generator circuit 300, the frequency voltage generator circuit 400, and the output circuit 500 are identical respectively to the reference voltage generator circuit 10, the oscillation signal generator circuit 30, the frequency voltage generator circuit 40, and the output circuit 50 that are illustrated in FIG. 1, and thus their detailed description will not be repeated.

The voltage comparator circuit 200 includes the first comparator circuit 220, the second comparator circuit 240, and a pull-down (PD) driver (PDD) controller 260. Herein, the PDD controller 260 receives a first pulse Vs and a second pulse Vr from the first comparator circuit 220 and the second comparator circuit 240, respectively, to generate first and second control signals Y1 and Y2 for controlling PD drivers 224 and 244, respectively.

The first comparator circuit 220 includes a first pulse generator circuit 222 for comparing a first reference voltage V1 with a frequency voltage Vf to generate the first pulse Vs, and a first PD driver 224 for adjusting the driving capability of the first pulse generator circuit 222. Herein, the first PD driver 224 operates in response to the first control signal Y1. The second comparator circuit 240 includes a second pulse generator circuit 242 for comparing a second reference voltage V2 with the frequency voltage Vf to generate the second pulse Vr, and a second PD driver 244 for adjusting the driving capability of the second pulse generator circuit 242. Herein, the second PD driver 244 operates in response to the second control signal Y2.

In response to the first and second pulses Vs and Vr, the PDD controller 260 generates the first and second control signals Y1 and Y2 to drive the PD drivers 224 and 244, respectively, in the state transition periods B and D.

The present invention reduces the driving capability of the voltage comparator circuit 200 in the state sustain periods A and C. Thus, in comparison with the typical oscillator, the oscillator 20 of the present invention can reduce the power consumption while generating the same high-frequency oscillation clock OSCK.

The first and second comparators 220 and 240 can be embodied in various ways.

Figure 6:
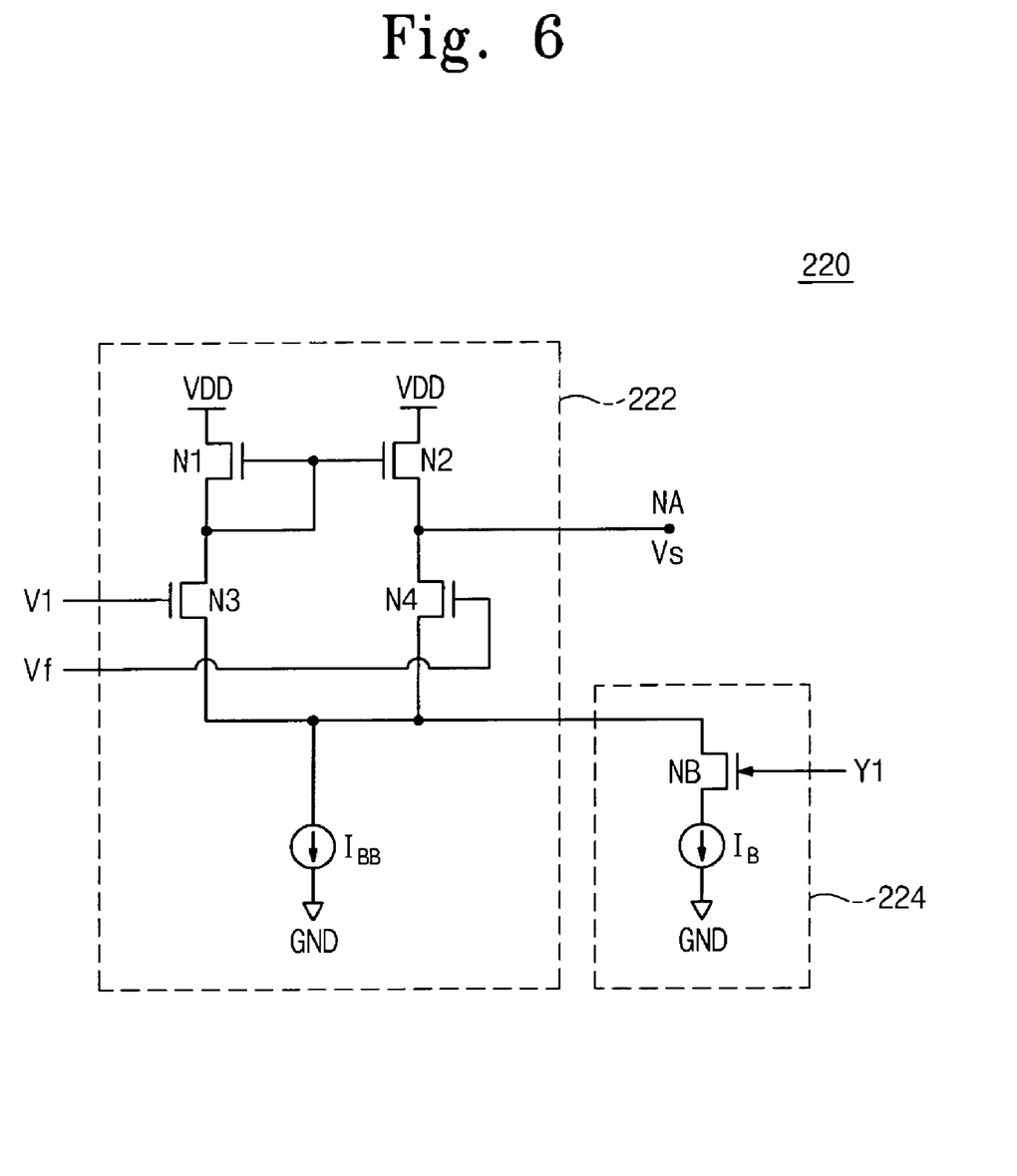
FIG. 6 is a diagram illustrating an embodiment of a comparator circuit using a differential amplifier circuit.

FIG. 6 is a diagram illustrating an embodiment of the comparator circuit 220 using a differential amplifier circuit.

Referring to FIG. 6, the first comparator circuit 220 includes a first pulse generator circuit 222 for receiving the first reference voltage V1 and the frequency voltage Vf to generate the first pulse Vs, and a first PD driver 224 for adjusting the driving capability of the first pulse generator circuit 222 in response to the first control signal Y1. As illustrated in FIG. 6, the first PD driver 224 may be implemented using a bias current source IB and an NMOS transistor NB. Like the first comparator circuit 220, the second comparator circuit 240 may be implemented as illustrated in FIG. 6.

When the current source is used in the comparator circuit as described above, the oscillator of the present invention can greatly reduce the power consumption in comparison with the typical oscillator. The reason for this is that the typical oscillator must consume a constant power independent of the frequency of an oscillation clock. Thus, the typical oscillator is to be used for high-frequency oscillation, it is necessary to embody a current source with high power consumption. However, the oscillator of the present invention includes an additional current source that is used selectively depending on the oscillation periods. In particular, the comparator circuits 220 and 240 of the present invention are designed not to use an additional current source after completion of voltage latch. Thus, in comparison with the typical oscillator, the oscillator 20 of the present invention can reduce the total power consumption even when used for high-frequency oscillation.

Figure 7:
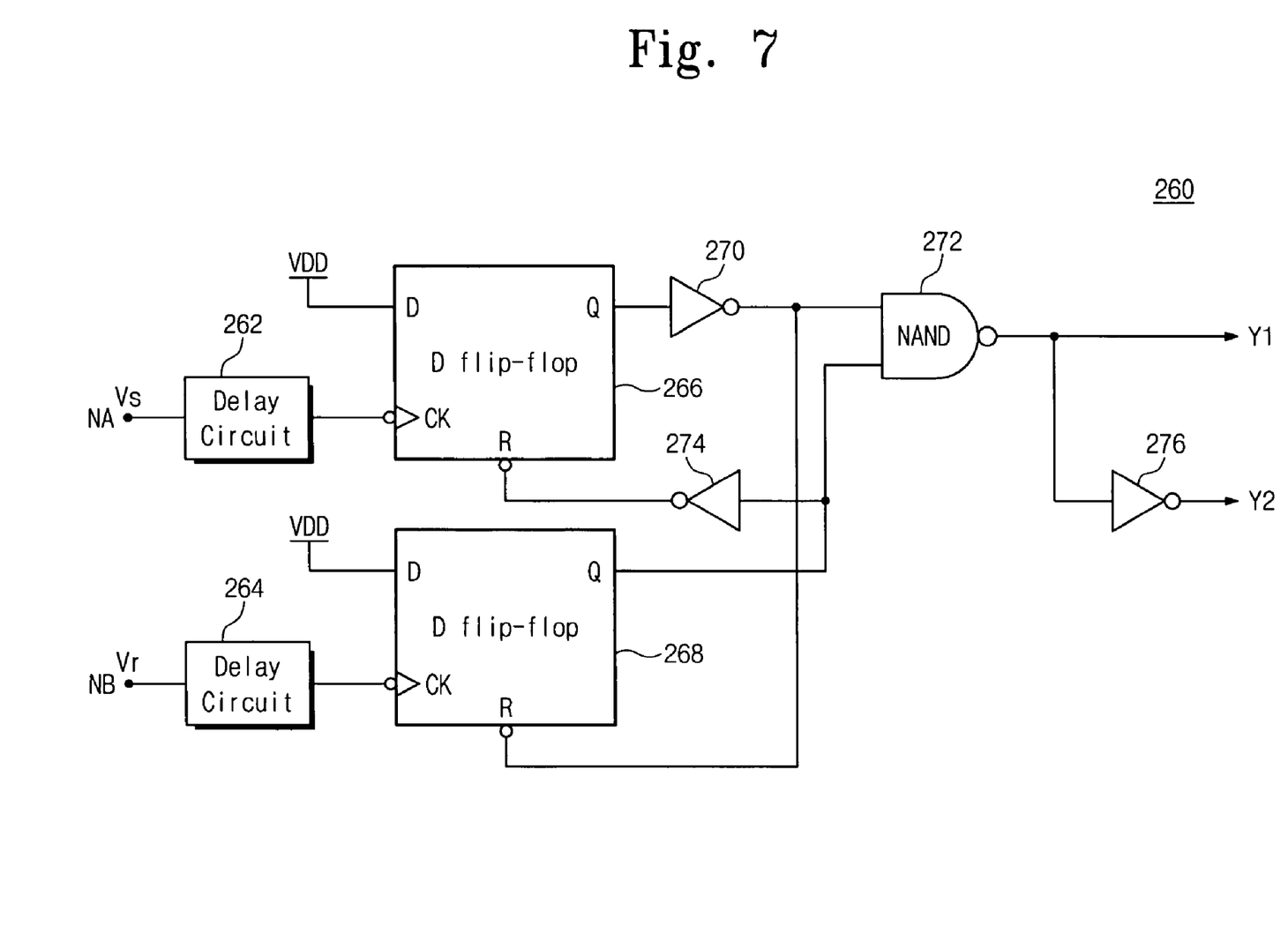
FIG. 7 is a diagram illustrating an embodiment of a PDD controller illustrated in FIG. 5.

FIG. 7 is a diagram illustrating an embodiment of the PDD controller 260 illustrated in FIG. 5.

Referring to FIG. 7, the PDD controller 260 includes delay circuits 262 and 264, flip-flops 266 and 268, inverters 270, 274 and 276, and a NAND logic circuit 272. Herein, the delay circuits 262 and 264 are used to delay the pulses Vs and Vr by a predetermined time. This delays the generation time of the control signals Y1 and Y2 by a predetermined time. Although the delay circuits 262 and 264 are illustrated in FIG. 7, they are not necessarily required. That is, the PDD controller 260 may be implemented without using the delay circuits 262 and 264.

Using the pulses Vs and Vr output from the comparator circuits 220 and 240, the PDD controller 260 generates the control signals Y1 and Y2 for operating the PD drivers 224 and 244. Herein, the first flip-flop 266 is reset in response to a signal that results from inverting an output of the second flip-flop 268 by the inverter 274, and the second flip-flop 268 is reset in response to a signal that results from inverting an output of the first flip-flop 266 by the inverter 270.

Figure 8:
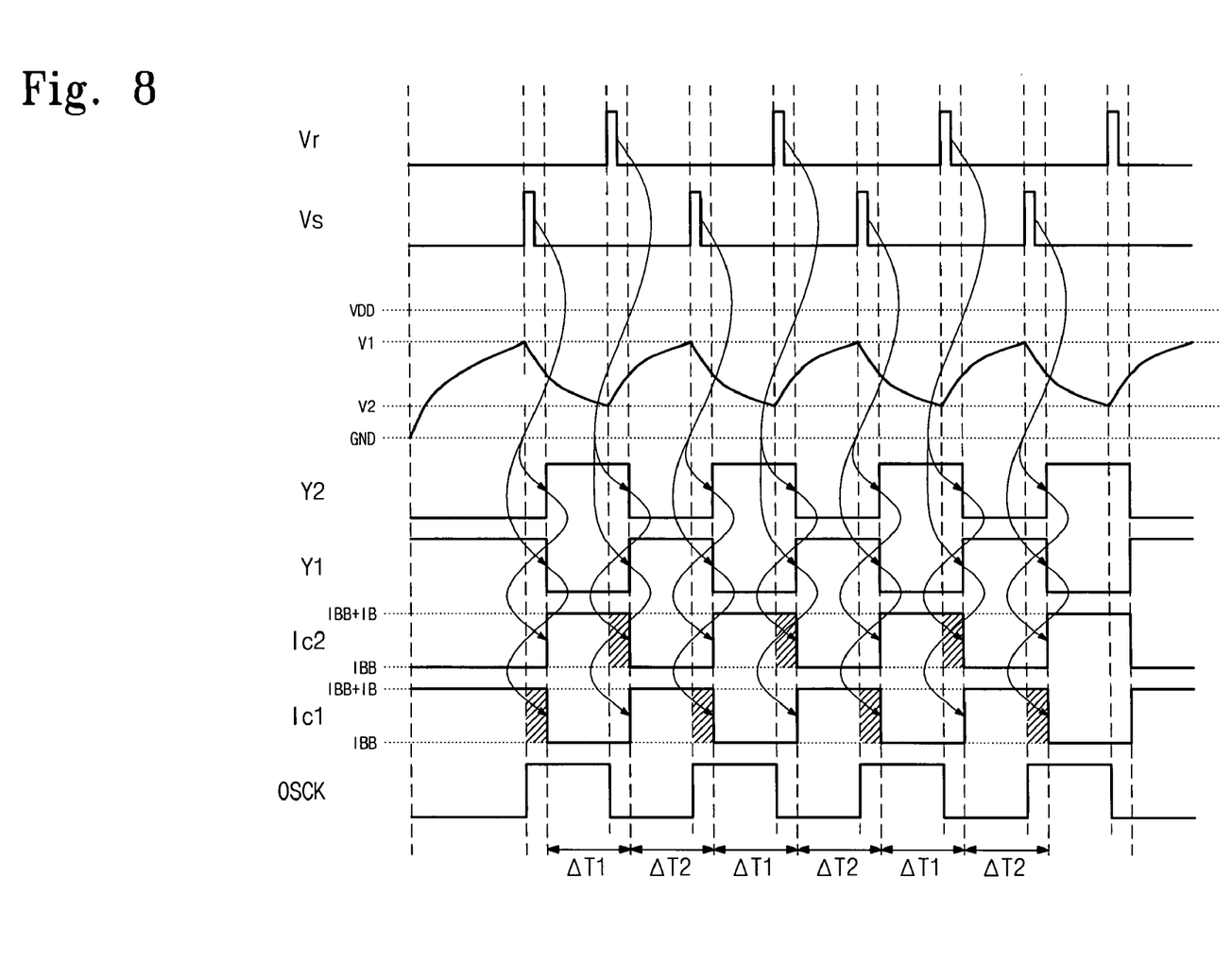
FIG. 8 is a timing diagram illustrating the generation of an oscillation clock of an oscillator using the PDD controller illustrated in FIG. 7.

FIG. 8 is a timing diagram illustrating the generation of an oscillation clock OSCK of the oscillator 20 using the PDD controller 260 illustrated in FIG. 7. The PD drivers 224 and 244 of the oscillator 20 are implemented using the current source IB as illustrated in FIG. 6.

Referring to FIGS. 5 through 8, the oscillation clock OSCK is generated as follows. The first pulse Vs is generated by the first comparator circuit 220. The first flip-flop 266 is synchronized in response to the first pulse Vs that transitions from high level to low level. At this point, the first flip-flop 266 latches a supply voltage VDD. Herein, the supply voltage VDD is at a high level. The latched high-level signal is inverted by the inverter 270. Thus, a low-level signal is provided to the NAND logic circuit 272.

At this point, the second pulse Vr is in a low-level state and the second flip-flop 268 maintains a low-level state. An output of the second flip-flop 268, i.e., a low-level signal, is provided to the NAND logic circuit 272. Thus, the NAND logic circuit 272 NAND-operates the two low-level signals to output the high-level first control signal Y1.

Also, the inverter 276 inverts the first control signal Y1 to output the second control signal Y2. Thus, the first control signal Y1 and the second control signal Y2 are output complementarily. That is, the first control signal Y1 is in a high-level state for a predetermined period ΔT1, while the second control signal Y2 is in a low-level state for the predetermined period ΔT1. Consequently, the first comparator circuit 220 is driven by current sources IBB and IB for the predetermined period ΔT1, while the second comparator circuit 240 is driven by the current source IBB for the predetermined period ΔT1.

Thereafter, the second pulse Vr is generated by the second comparator circuit 240. The second flip-flop 268 is synchronized in response to the second pulse Vr that transitions from high level to low level. At this point, the second flip-flop 268 latches the supply voltage VDD. Herein, the supply voltage VDD is at a high level. Thus, the NAND logic circuit 272 receives a high-level signal from the second flip-flop 268.

The inverter 274 inverts the high-level signal output from the second flip-flop 268. The first flip-flop 266 is reset in response to the inverted low-level signal. Thus, the first flip-flop 266 outputs a low-level signal. The inverter 270 inverts the low-level signal received from the first flip-flop 266 to output a high-level signal. The NAND logic circuit 272 NAND-operates the high-level signal from the inverter 270 and the low-level signal from the second flip-flop 268 to output the first control signal Y1. Accordingly, the first control signal Y1 becomes a low-level state and the second control signal Y2 becomes a high-level state.

The first control signal Y1 is in a low-level state for a predetermined period ΔT2, while the second control signal Y2 is in a high-level state for the predetermined period ΔT2. Consequently, the first comparator circuit 220 is driven by the current source IB for the predetermined period ΔT2, while the second comparator circuit 240 is driven by the current sources IBB and IB for the predetermined period ΔT2. The oscillator 20 repeats the above operations to generate the oscillation clock OSCK.

When the delay circuits 262 and 264 are suitably used, the predetermined periods ΔT1 and ΔT2 can be reduced. Thus, the PDD controller 260 with the delay circuits 262 and 264 is implemented in such way that the additional current source IBB is driven in the minimum period including a hatched region of FIG. 8 (i.e., the state transition period).

Referring to FIG. 8, the first control signal Y1 becomes a low-level state in response to the first pulse Vs, and becomes a high-level state in response to the second pulse Vr. In contrast, the second control signal Y2 becomes a low-level state in response to the second pulse Vr, and becomes a high-level state in response to the first pulse Vs. That is, the first comparator circuit 220 is driven only by the current source IB from the generation of the first pulse Vs to immediately after the generation of the second pulse Vr. In contrast, the second comparator circuit 240 is driven only by the current source IB from the generation of the second pulse Vr to immediately after the generation of the first pulse Vs. Herein, the period from the generation of the first pulse Vs to immediately after the generation of the second pulse Vr, and the period from the generation of the second pulse Vr to immediately after the generation of the first pulse Vs correspond to the state sustain periods.

In the oscillator 20 of the present invention, the comparator circuits 220 and 240 are driven by the different current sources depending on the oscillation periods. Referring to the hatched regions in FIG. 8 (i.e., the state transition periods), the comparator circuit 220/240 does not use the additional current source IBB after the generation of the pulse Vs/Vr.

Figure 9:
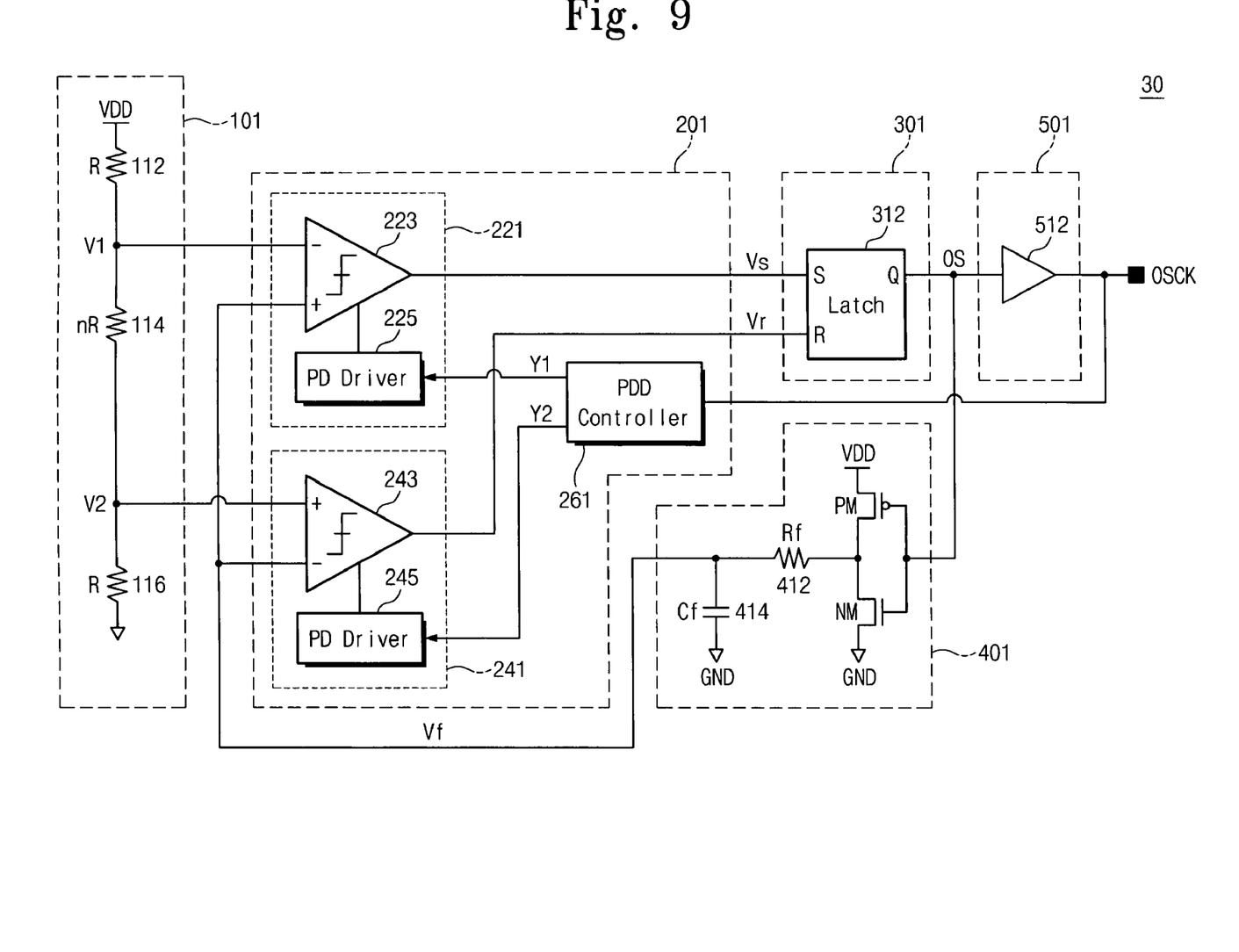
FIG. 9 is a diagram illustrating an oscillator according to another embodiment of the present invention.

Although it has been described that the PDD controller 260 illustrated in FIG. 5 generates the control signals Y1 and Y2 using the pulses Vs and Vr output from the comparator circuits 220 and 240, the oscillator of the present invention should not be limited to such a configuration. As illustrated in FIG. 9, the oscillator of the present invention may use the oscillation clock OSCK to generate the control signals Y1 and Y2.

FIG. 9 is a diagram illustrating an oscillator according to another embodiment of the present invention.

Referring to FIG. 9, an oscillator 30 includes a reference voltage generator circuit 101, a comparator circuit 201, an oscillation signal generator circuit 301, a frequency voltage generator circuit 401, and an output circuit 501. Herein, the reference voltage generator circuit 101, the oscillation signal generator circuit 301, the frequency voltage generator circuit 401, and the output circuit 501 are implemented in the same way as the reference voltage generator circuit 100, the oscillation signal generator circuit 300, the frequency voltage generator circuit 400, and the output circuit 500 that are illustrated in FIG. 5. The comparator circuit 201 includes a PDD controller 261 that receives an oscillation clock OSCK to generate first and second control signals Y1 and Y2.

Figure 10:
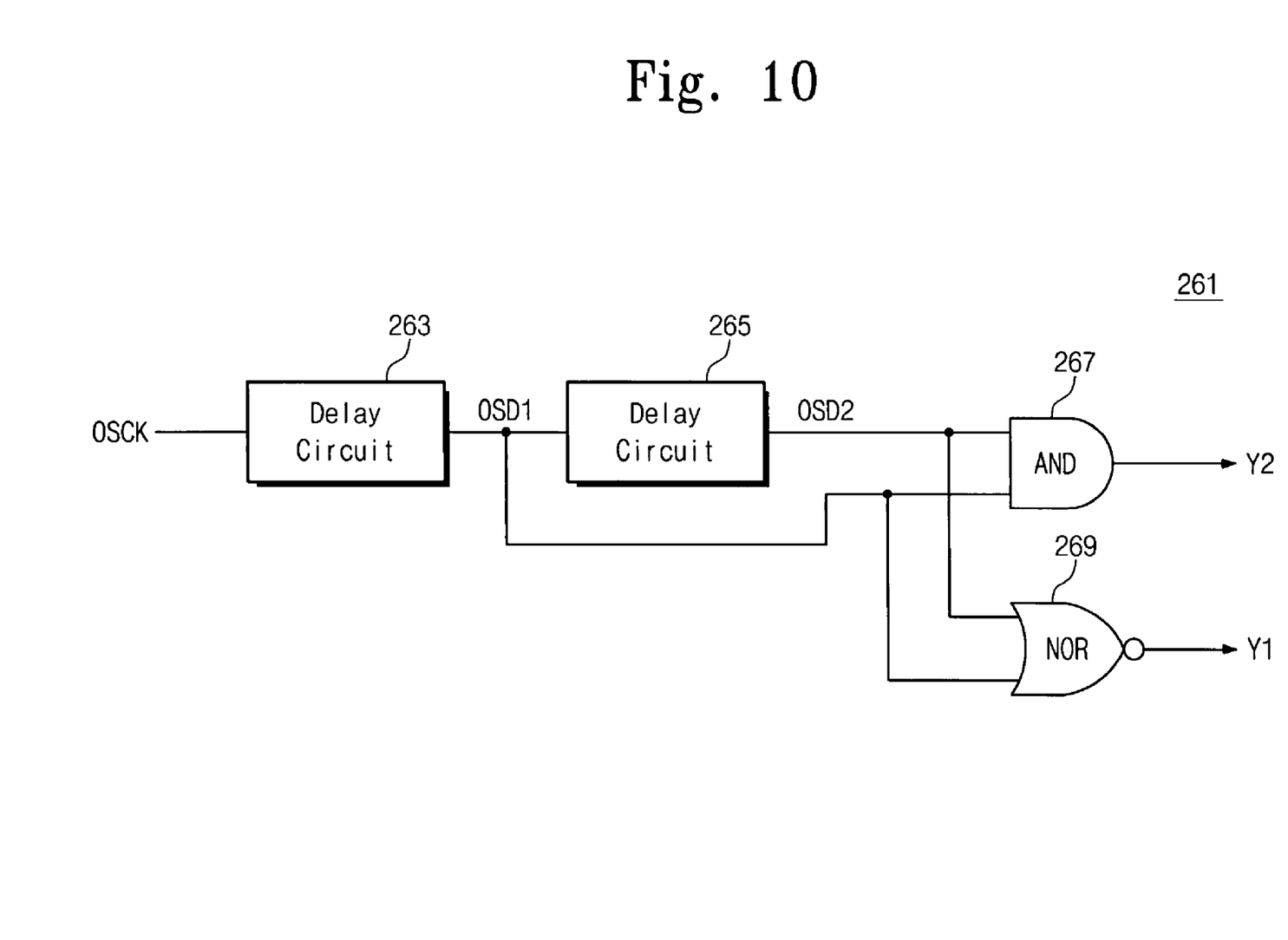
FIG. 10 is a diagram illustrating an embodiment of a PDD controller illustrated in FIG. 9.

FIG. 10 is a diagram illustrating an embodiment of the PDD controller 261 illustrated in FIG. 9.

Referring to FIG. 10, the PDD controller 261 includes first and second delay circuits 263 and 265, an AND logic circuit 267, and a NOR logic circuit 269.

Figure 11:
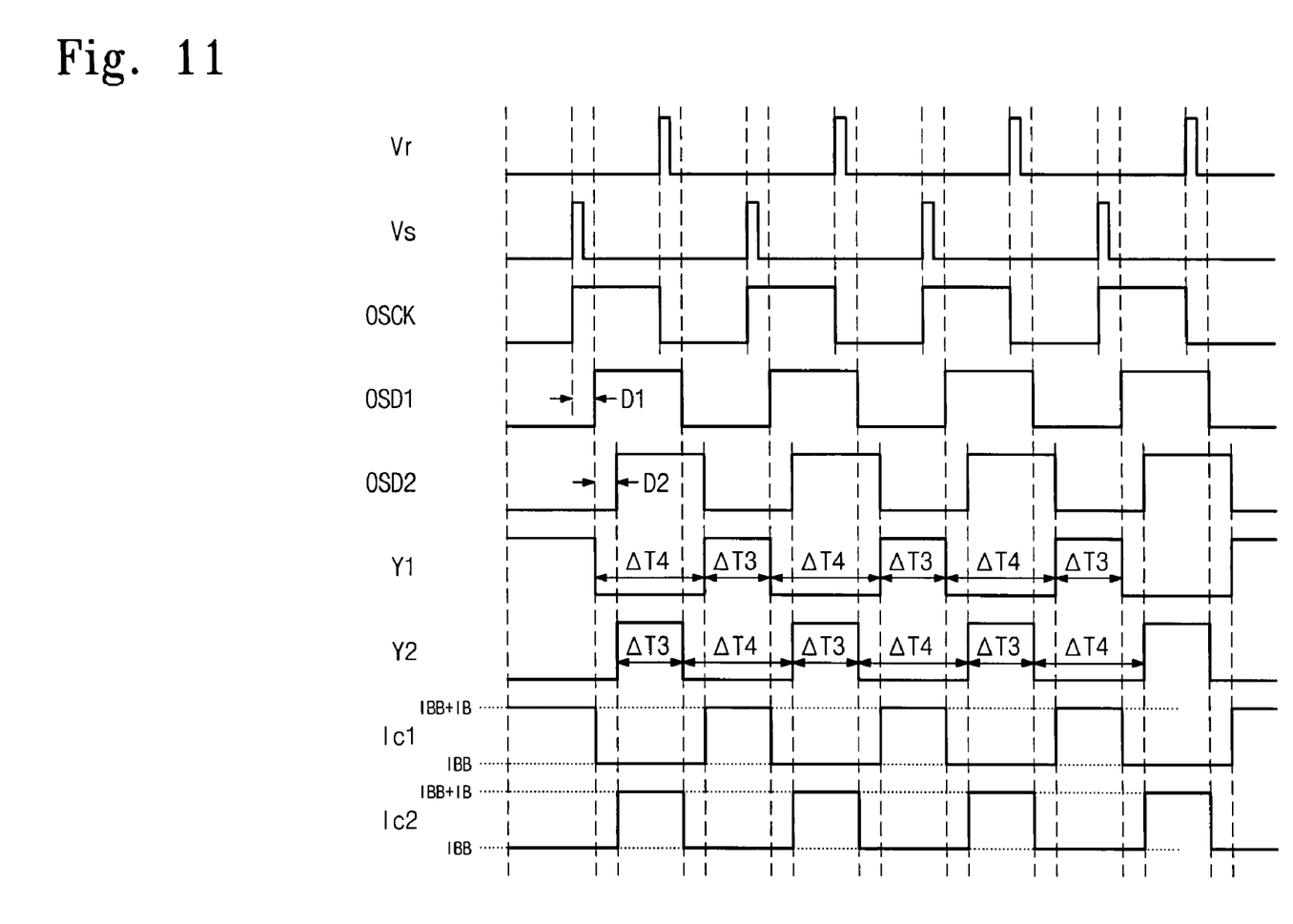
FIG. 11 is a timing diagram illustrating the generation of an oscillation clock of an oscillator using the PDD controller illustrated in FIG. 10.

FIG. 11 is a timing diagram illustrating the generation of an oscillation clock OSCK of the oscillator 30 using the PDD controller 261 illustrated in FIG. 10.

Referring to FIGS. 9 through 11, the oscillation clock OSCK is generated as follows. An oscillation signal OS is generated in response to pulses Vs and Vr output from the comparator circuit 201. The first delay circuit 263 receives the oscillation clock OSCK to output a signal OSD1 delayed by a first delay time D1. The second delay circuit 265 receives the delayed signal OSD1 to output a signal OSD2 delayed by a second delay time D2. The AND logic circuit 267 AND-operates the delayed signal OSD1 and the delayed signal OSD2 to output the second control signal Y2.

The NOR logic circuit 269 NOR-operates the delayed signal OSD1 and the delayed signal OSD2 to output the first control signal Y1. Herein, the output control signals Y1 and Y2 are the same as illustrated in FIG. 11. That is, the first control signal Y1 maintains a high-level state for a predetermined period ΔT3 and maintains a low-level state for a predetermined period ΔT4. Also, the second control signal Y2 maintains a high-level state for a predetermined period ΔT3 and maintains a low-level state for a predetermined period ΔT4.

As described above, the oscillator of the present invention reduces the driving capability of the comparator circuits upon completion of the voltage latch, thereby reducing the power consumption. In detail, the driving capability of the comparator circuits of the present invention is reduced after the voltage latch. The oscillator of the present invention adjusts the driving capability of the comparator circuits using the PD drivers. In particular, the PD driver is implemented using the current source. Thus, in comparison with the typical oscillator, the oscillator of the present invention can reduce the power consumption even when used for high-frequency oscillation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An oscillator comprising:
   a first comparator circuit generating a first pulse when a frequency voltage reaches a first reference voltage;
   a second comparator circuit generating a second pulse when the frequency voltage reaches a second reference voltage;
   an oscillation signal generator circuit generating an oscillation signal by latching a first voltage in response to the first pulse and latching a second voltage in response to the second pulse; and
   a frequency voltage generator circuit raising or lowering the frequency voltage in response to the oscillation signal,
   wherein the driving capability of the first comparator circuit is reduced at the latching of the first voltage and is restored at the latching of the second voltage, and the driving capability of the second comparator circuit is reduced at the latching of the second voltage and is restored at the latching of the first voltage,
   wherein the first comparator circuit comprises a first pull-down driver for adjusting the driving capability thereof, and the second comparator circuit comprises a second pull-down driver for adjusting the driving capability thereof,
   wherein the first and second pull-down drivers are implemented using current sources.

2. The oscillator of claim 1, wherein the frequency voltage is raised or lowered using an RC time constant.

3. The oscillator of claim 1, further comprising a pull-down driver controller receiving the first and second pulses to drive the first and second pull-down drivers.

4. The oscillator of claim 3, wherein the pull-down driver controller generates a first control signal for driving the first pull-down driver and a second control signal for driving the second pull-down driver.

5. The oscillator of claim 4, wherein the first and second control signals are output complementarily.

6. The oscillator of claim 5, wherein the pull-down driver controller comprises:
   a first flip-flop latching a supply voltage in response to the first pulse;
   a second flip-flop latching the supply voltage in response to the second pulse;
   a first inverter inverting an output of the first flip-flop;
   a second inverter inverting an output of the second flip-flop;
   a NAND logic circuit NAND-operating an output of the first inverter and an output of the second inverter to generate the first control signal; and
   a third inverter inverting the first control signal to generate the second control signal, wherein the first flip-flop is reset in synchronization with the output of the second inverter; and
   the second flip-flop is reset in synchronization with the output of the first inverter.

7. The oscillator of claim 6, wherein the first and second pulses are delayed and provided respectively to the first and second flip-flops.

8. The oscillator of claim 1, further comprising an output circuit outputting the oscillation signal.

9. The oscillator of claim 1, wherein a time of the restoration of the driving capability of the first comparator circuit is delayed by a first time, and a time of the restoration of the driving capability of the second comparator circuit is delayed by a second time.

10. The oscillator of claim 9, further comprising a pull-down driver controller for driving the first and second pull-down drivers.

11. The oscillator of claim 10, wherein the pull-down driver controller generates a first control signal for driving the first pull-down driver and a second control signal for driving the second pull-down driver.

12. The oscillator of claim 11, wherein the pull-down driver controller comprises:
   a first delay circuit delaying the oscillation signal by a first time;
   a second delay circuit delaying an output of the first delay circuit by a second time;
   an AND logic circuit AND-operating an output of the first delay circuit and an output of the second delay circuit to generate the first control signal; and
   a NOR logic circuit NOR-operating the output of the first delay circuit and the output of the second delay circuit to generate the second control signal.

13. A method for operating an oscillator, comprising:
   latching a first voltage from a rising frequency voltage;
   latching a second voltage from a lowering frequency voltage; and
   sequentially latching the first voltage and the second voltage to output an oscillation signal,
   wherein the frequency voltage is raised or lowered in response to the oscillation signal; and
   a driving capability is reduced at the latching of the first voltage and is restored at the latching of the second voltage, or the driving capability is reduced at the latching of the second voltage and is restored at the latching of the first voltage,
   wherein the driving capability is adjusted by providing a first comparator circuit comprising a first pull-down driver and by providing a second comparator circuit comprising a second pull-down driver,
   wherein the first and second pull-down drivers are implemented using current sources.

* * * * *